United States Patent

[11] 3,605,061

[72] Inventor Orval J. Martin
Toledo, Ohio

[21] Appl. No. 758,277
[22] Filed Sept. 9, 1968
[45] Patented Sept. 14, 1971
[73] Assignee The Reliance Electric and Engineering Company

[54] PRINTED CIRCUIT BOARD
3 Claims, 2 Drawing Figs.

[52] U.S. Cl. .................................................... 339/17, 317/101, 339/176
[51] Int. Cl. .................................................... H01r 13/50, H05k 1/04
[50] Field of Search .......................................... 339/17, 176.17; 317/101 C

[56] References Cited

UNITED STATES PATENTS

| | | | |
|---|---|---|---|
| 2,882,511 | 4/1959 | Mason | 339/176 MP |
| 3,152,388 | 10/1964 | Grossman | 29/626 |
| 3,496,516 | 2/1970 | McFadden | 339/18 B |

FOREIGN PATENTS

| | | | |
|---|---|---|---|
| 1,528,918 | 5/1968 | France | 339/17 LC |
| 1,125,990 | 3/1962 | Germany | 339/17 LM |

*Primary Examiner*—James A. Leppink
*Assistant Examiner*—Terrell P. Lewis
*Attorney*—Thomas H. Grafton

ABSTRACT: A printed circuit board and system. The board is of insulating material with circuit patterns secured to each side of the board and terminals emanating from the circuit patterns along two edges of the board. The system includes the board with a circuit or component connected by the circuit patterns to the terminals, a first connector interconnecting at least two of the terminals at one edge of the board for internal circuit or component wiring, and a second connector connected to at least two of the terminals at the other edge of the board for external wiring.

INVENTOR.
ORVAL J. MARTIN
BY
Thomas H. Grafton
ATTORNEY

INVENTOR.
ORVAL J. MARTIN
BY
Thomas H. Grafton
ATTORNEY

PRINTED CIRCUIT BOARD

BACKGROUND OF THE INVENTION

1. Field of the Invention

The invention relates to plug-in printed circuit boards.

2. Description of the prior art

Plug-in circuit boards have terminals along one side only. Jumpers for internal and external circuitry are applied to these terminals requiring all the wiring to be done inside the housing into which the boards are plugged. Internal wiring has been done in the printed circuit itself. However, then the board is peculiar to a particular circuit.

SUMMARY OF THE INVENTION

The invention envisions a printed circuit board having terminals along two opposite edges of the board. The board is plugged into external circuitry by means of the terminals along one edge of the board and jumpers for internal circuitry are on a plug-on connector carried on the board at the terminals on the other edge of the board. This reduces the wiring needed inside the housing into which the board is plugged. To replace a board, it is unplugged from the external circuits, the plug-on connector is removed and plugged on a new board, and the new board is plugged into the external circuits.

One primary object is to improve and simplify printed circuit boards.

Another object is to improve and simplify printed circuit board systems by providing terminals along two edges of a printed circuit board with two connectors one on one of the edges for internal wiring and the other on the other edge for external wiring.

Another object is to provide a universal printed circuit board which can e connected in pluralities in any desired arrangement to obtain particular circuitry.

DESCRIPTION OF THE PREFERRED EMBODIMENT.

Figure 1:
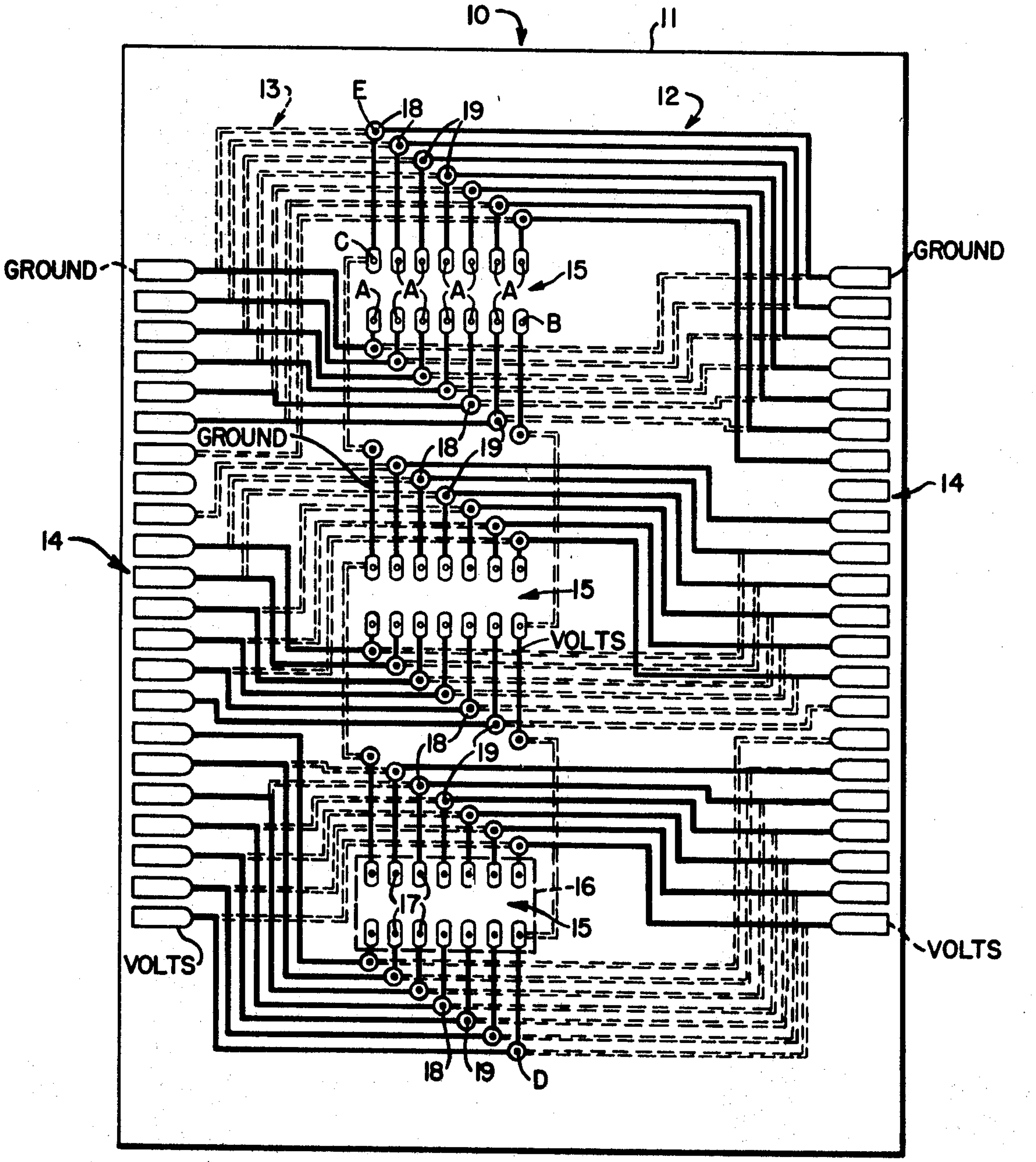
FIG. 1 is a plan-view of the printed circuit board.

The printed circuit board 10 includes a board of insulating material 11 having circuit patterns 12 and 13 secured to each side of the board. Pattern 12 is secured to the front of the board 10 as viewed in FIG. 1 and pattern 13 is secured to the back of the board. Terminals 14 emanate from the circuit patterns 12 and 13 along two opposite edges of the board, the terminals 14 being o the front and back of the board at each of such two opposite edges.

Figure 2:
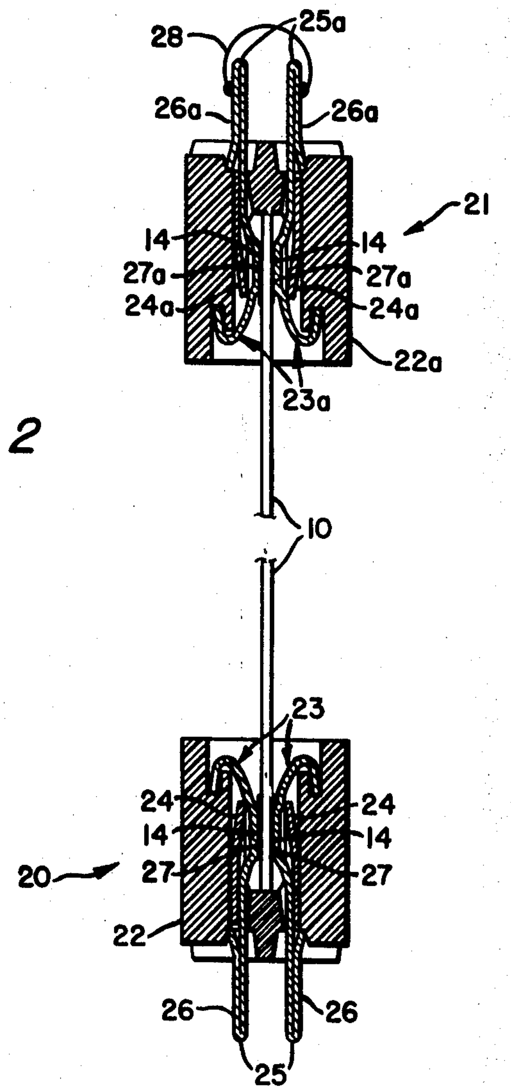
FIG. 2 is a transverse cross-sectional view showing two connectors, one interconnecting two of the board terminals at the top of the board for internal wiring and one connected to two of the board terminals at the bottom of the board for external wiring.

The terminals 14 as shown in FIG. 2 are slightly thicker than the patterns 12 and 13 from which they emanate, the terminals 14 and patterns 12 and 13 being substantially flush with the sides of the board 10 due to the thickness of the printed circuitry.

The board 10 defines three sets of openings 15 therethrough. Each set consists in 14 holes for the reception of a plug-in circuit or component 16. Only one of the three circuits or components 16 is shown for the sake of simplicity and it is shown in ghost lines so as not to conceal the structure therebelow. The plug-in circuit or component 16 includes 14 pins 17 which are received in the respective openings 15. The plug-in circuit can be an integrated circuit pack including several logic circuits, such as AND and OR gates, for example, or it can be a component, such as a resistor. It is not necessary that the plug-in circuit or component have enough pins 17 to fill in all of the respective holes 15. The diameters of the pins 17 are small enough that solder applied to the pins on the back of the board comes through the holes 15 around the pins to electrically connect each pin to both sides of the board.

The board 10 also defines three second sets of openings 18 therethrough, there being one set of openings 18 for each set of openings 15. Each second set consists in 14 holes 18 each of which is connected to an adjacent hole 15 through the circuit pattern 12 on the front of the board. The holes 18 are filled with electrical conducting means 19, such as copper, to electrically connect each of the holes 15 to the circuit pattern 13 on the back of the board.

The upper set of openings 15 are further identified by the letters A, B, and C as an aid in tracing representative circuitry. Holes 15–A each is connected to a copper-filled opening 18 by circuit pattern 12 on the front of the board 10 and further is connected from such opening 18 by the circuit pattern 12 to a terminal 14 on the front of the board. Holes 15–A each also is connected by circuit pattern 13 on the back of the board from its copper-filled opening 18 to a terminal 14 on the back of the board and on the opposite edge of the board. That is, each of the holes 15–A and thus, the soldered pins 17 received therein is electrically connected by the circuit patterns and copper-filled hole 18 to a terminal 14 at one of the board edges and also to a terminal 14 at the opposite board edge. Hole 15–B is a special case; it is connected to voltage terminals 14 indicated by "VOLTS" . One of the voltage terminals 14 is connected by circuit pattern 12 on the front of the board to point D and the other voltage terminal 14 is connected by circuit pattern 13 on the back of the board to point D. It is easy to trace the connection of hole 15–B through the circuit patterns 12 and 13 to voltage point D. Hole 15–C also is a special case; it is connected to ground terminals 14 indicated by "GROUND" . One of the ground terminals 14 is connected by circuit pattern 12 on the front of the board to point E and the other ground terminal 14 is connected by circuit pattern 13 on the back of the board to point E. It is easy to trace the connection of hole 15–C through the circuit pattern 12 on the front of the board to point E and the connection of point E through the circuit patterns 12 and 13 with the other ground connections on the board.

A suitable printed circuit connector for the board 10 is shown in U.S. Pat. No. 2,882,511, issued Apr. 14, 1959 to Willard F. Mason. However, whereas the patent discloses the connector applied to a printed circuit board at one edge only as is usual in the prior art, the circuit board 10 uses two of the connectors applied to opposite board edges. The patent discloses contact members extending from the connector (members 12 in the patent) having portions (portions 21 in the patent) which are inserted into a receptacle for external wiring. The connector then is secured to such receptacle by means of openings shown in the patent for the reception of screws. If connections for external wiring are soldered to the contact member portions (portions 21 in the patent), leads may be soldered to other contact member portions to complete circuits to the printed circuit elements on the card itself. In order to reduce the wiring in such a receptacle, the board 10 has terminals 14 along two opposite edges of the board. The board 10 is plugged into external circuitry by means of the terminals 14 along one edge of the board and jumper for internal circuitry are on a plug-on connector carried on the board at the terminals 14 on the other edge of the board.

Since the connector is shown in detail in the above U.S. Pat. No. 2,882,511, only a vertical transverse cross sectional view is shown in FIG. 2, two connectors being used with the board 10 one stationary connector 20 for external wiring and one connector 21 for internal wiring.

Connector 20 includes an insulating body portion 22 having a cavity which houses contact elements 23 each made in the shape shown in FIG. 2 and each being joined at a point adjacent the lower end of the cavity to a spring member 24. Each contact 23 extends downwardly through an aperture and is provided with a 180° bend at the point 25 to form a circuit connecting portion 26. The connector 20 is secured to a housing and external wiring (not shown) is soldered to the contact portions 26. The printed circuit board 10 is inserted between the contacts 23 with contact portions 27 each tightly engaging a terminal 14.

Connector 21 is the same as connector 20; similar reference numbers refer to like parts. Connector 21 is a plug-on connector which is carried by the printed circuit board, contact portions **27*a* each tightly engaging a terminal 14. A jumper wire 28 is soldered to the contact portions 26*a* to interconnect two circuit board terminals 14 for internal circuit or component wiring. Of course, the jumper wire 28 need not connect directly opposite contact portions 26*a* as shown but rather can connect one of the contact portions 26*a* shown to another contact portion 26*a*** down the line now shown.

To replace a circuit board 10, it is unplugged from the stationary connector 20 (unplugged from external circuits), the plug-on connector 21 is removed (unplug internal circuit wiring) and plugged on a new board, and the new board is plugged into the stationary connector 20.

It is to be understood that the above description is illustrative of this invention and that various modifications thereof can be utilized without departing from its spirit and scope.

Having described the invention, I claim:

1. A printed circuit board comprising, in combination, a board of insulating material, circuit patterns secured to each side of the board, and terminals emanating from the circuit patterns along two edges of the board, the board defining at least one set of openings therethrough for the reception of a plug-in circuit or component and the circuit patterns and the terminals being substantially flush with the sides of the board, a plurality of the openings being connected by the circuit patterns to terminals at one of the board edges and a plurality of the openings being connected to terminals at the other of the board edges, the terminals being wider than the circuit patterns and suitable for receiving plug-in or plug-on connectors, the board defining a second set of openings connected by the circuit patterns to said at least one set of openings, and electrical conducting means filling the second set of openings, whereby each opening of said at least one set of openings is connected to the circuit patterns on both sides of the board.

2. A printed circuit board according to claim 1 wherein one of the terminals at one of the board edges and one of the terminals at the other of the board edges are ground terminals connected by the circuit patterns to said at least one set of openings.

3. A printed circuit board according to claim 1 wherein one of the terminals at one of the board edges and one of the terminals at the other of the board edges are voltage terminals connected by the circuit patterns to said at least one set of openings.